(12) United States Patent
Kim et al.

(10) Patent No.: US 10,886,920 B2
(45) Date of Patent: Jan. 5, 2021

(54) OUTPUT BUFFER CIRCUIT

(71) Applicant: DB HiTek Co., Ltd., Seoul (KR)

(72) Inventors: Mun-Gyu Kim, Seoul (KR);
Kyung-Tae Kim, Seongnam-si (KR);
Jae-Hong Ko, Seoul (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 16/814,881

(22) Filed: Mar. 10, 2020

(65) Prior Publication Data

US 2020/0343893 A1 Oct. 29, 2020

(30) Foreign Application Priority Data

Apr. 26, 2019 (KR) .................. 10-2019-0049291

(51) Int. Cl.
*H03K 5/12* (2006.01)
*H03K 19/0185* (2006.01)
*G09G 3/36* (2006.01)

(52) U.S. Cl.
CPC ... *H03K 19/018521* (2013.01); *G09G 3/3696* (2013.01); *G09G 2310/0291* (2013.01); *G09G 2310/08* (2013.01)

(58) Field of Classification Search
CPC ......... H03K 19/018521; G09G 3/3696; G09G 2310/08; G09G 2310/0291
See application file for complete search history.

(56) References Cited

U.S. PATENT DOCUMENTS

| 8,466,909 B2 | 6/2013 | An et al. | |
| 2011/0148893 A1 | 6/2011 | An et al. | |
| 2011/0199366 A1* | 8/2011 | Tsuchi | G09G 3/3688 |
| | | | 345/212 |
| 2015/0084694 A1* | 3/2015 | Lee | H03F 3/301 |
| | | | 330/255 |
| 2017/0032755 A1* | 2/2017 | Ko | G09G 3/3648 |

FOREIGN PATENT DOCUMENTS

KR 10-1579839 B1 12/2015

OTHER PUBLICATIONS

Chang-Ho An et al.; "Output Buffer Having High Slew Rate Method for Controlling the Output Buffer and Display Drive IC Using the Same"; Bibliographic Data of KR10-1579839 (B1); Dec. 23, 2015; http://worldwide.espacenet.com.

* cited by examiner

*Primary Examiner* — Kenneth B Wells
(74) *Attorney, Agent, or Firm* — Andrew D. Fortney; Central California IP Group, P.C.

(57) ABSTRACT

An output buffer circuit is disclosed to achieve a high slew rate without increasing current consumption. The output buffer circuit includes an input circuit configured to output a first signal and a second signal in response to an input signal, and a slew rate control circuit configured to connect one of the first signal and the second signal to an output terminal to control a slew rate of an output signal based on or in response to a potential difference between the input signal and the output signal.

17 Claims, 7 Drawing Sheets

OUTPUT BUFFER CIRCUIT

CROSS-REFERENCE TO RELATED APPLICATION

The present application claims priority to Korean Patent Application No. 10-2019-0049291, filed Apr. 26, 2019, the entire contents of which are incorporated herein for all purposes by this reference.

BACKGROUND OF THE INVENTION

Field of the Invention

The present invention relates to an output buffer circuit and, more particularly, to a buffer amplification circuit of a display driver IC in a liquid crystal display device.

Description of the Related Art

Recently, the demand for low power and high-resolution displays is rapidly increasing. A high slew rate performance is desired for a display driver IC (DDI) to make it possible to charge the display panel in a short time period.

There is a technology that improves the overall performance by increasing the current consumption of the amplifier (AMP) that is responsible for the source that implements a high slew rate.

However, the display device using such method of increasing the current consumption of the amplifier may have difficulty applying the increased current consumption to a portable electronic device using a battery.

Accordingly, research on display driving devices having a high slew rate without increasing the current consumption has been continuously conducted.

However, the conventional output buffer circuits have a problem in that a short circuit current occurs due to the coupling effect caused by a compensation capacitor during the slew rate boosting operation because the output signal changes rapidly due to the input signal.

In addition, another problem with conventional output buffer circuits is that it is difficult to solve the problem of overcurrent when applied to the product because the short circuit current occurs.

SUMMARY OF THE INVENTION

Accordingly, the present invention has been made keeping in mind the above problems occurring in the prior art, and an objective of the present invention is to provide an output buffer circuit that achieves a high slew rate without increasing the current consumption.

It is another objective of the present invention to provide an output buffer circuit that prevents the occurrence of a short circuit current while achieving a high slew rate.

The present invention can be implemented by various embodiments having the following configuration(s) to achieve the above objectives.

An output buffer circuit according to various embodiments of the present invention includes an input circuit configured to output a first signal and a second signal in response to an input signal, and a slew rate control circuit connecting the first signal or the second signal to an output terminal to control a slew rate of an output signal (e.g., on the output terminal) based on or in response to a potential difference between the input signal and the output signal.

The slew rate control circuit may include a first driver transistor and a second driver transistor, and the slew rate may be controlled by diode-connecting one of the first driver transistor and the second driver transistor based on or in response to the potential difference.

The slew rate control circuit may be in a rising slew state when the input signal is greater than (e.g., has a voltage greater than) the output signal and a falling slew state when the input signal is less than (e.g., has a voltage less than) the output signal.

The slew rate control circuit may include a first switch transistor that is on when the potential difference is equal to or greater than a reference voltage (e.g., a first reference voltage) in the rising slew state and a first driver transistor configured to boost the slew rate when the first switch transistor is on. Under such conditions, the first driver transistor may be diode-connected (e.g., function as a diode-connected transistor).

The slew rate control circuit may further include a second switch transistor that is on when the potential difference is equal to or greater than a reference voltage (e.g., the first and or second reference voltage) in the falling slew state and a second driver transistor configured to boost the slew rate when the second switch transistor is on. Under such conditions, the second driver transistor may be diode-connected (e.g., function as a diode-connected transistor).

The first driver transistor may have a gate connected to a first output line of the input circuit, and a source connected to a highest level power supply. The second driver transistor may have a gate connected to a second output line of the input circuit, a source connected to a lowest level power supply, and a drain connected to a drain of the first driver transistor. The first switch transistor may have a gate configured to receive an input power supply (e.g., a first input power supply) and a source connected to the first output line. The second switch transistor may have a gate configured to receive the input power supply (e.g., the first or second input power supply), a source connected to the second output line, and a drain connected to the drain of the first switch transistor.

An output buffer circuit according to other embodiments of the present invention may include an input circuit configured to output a first signal and a second signal in response to an input signal, a slew rate control circuit connecting one of the first signal and the second signal to an output terminal (e.g., of the slew rate control circuit) and control a slew rate of an output signal (e.g., on the output terminal of the slew rate control circuit) based on or in response to a potential difference between the input signal and the output signal, and a driver control circuit connecting a power supply line with a compensation capacitor based on or in response to an input control signal.

The driver control circuit may (i) connect a highest level power supply line to a first compensation capacitor (e.g., by switching) when a first control signal is active, and (ii) connect a lowest level power supply line to a second compensation capacitor (e.g., by switching) when a second control signal is active. The second control signal may be an inverted first control signal.

The driver control circuit may include (i) a first control circuit between the highest level power supply line and a first output line of the input circuit, (ii) a second control circuit between the lowest level power supply line and a second output line of the input circuit, (iii) the first compensation capacitor, connected to the first control circuit and an output signal line, and (iv) the second compensation capacitor, connected to the second control circuit and the output signal line.

The first control circuit may connect the first compensation capacitor to the highest level power supply line when the input signal transitions and the first control signal is active. The first control circuit may include a first switch connected to the input circuit and the first compensation capacitor and a second switch connected to the highest level power supply line and the first compensation capacitor. The first control circuit may be configured to connect the first compensation capacitor with the highest level power supply line by turning the first switch off and the second switch on when the input signal transitions and the first control signal is active.

The second control circuit may be configured to connect the second compensation capacitor to the lowest level power supply line when the second control signal is active. The second control circuit may include a third switch connected to the input circuit and the second compensation capacitor, and a fourth switch connected to the lowest level power supply line and the second compensation capacitor. The second control circuit may be configured to connect the second compensation capacitor to the lowest level power supply line by turning the third switch to off and the fourth switch on when the input signal transitions and the second control signal is active.

An output buffer circuit according to still other embodiments of the present invention may include an input circuit configured to output a first signal and a second signal in response to an input signal, and a slew rate control circuit connecting one of the first signal and the second signal to an output terminal and control a slew rate of an output signal based on or in response to a potential difference between the input signal and the output signal, wherein the slew rate control circuit includes a first switch transistor that is on when the potential difference is equal to or greater than a reference voltage and the slew rate control circuit is in a rising slew state, a first driver transistor configured to output the first signal when the first switch transistor is on (and during which the first driver transistor may be diode-connected); a second switch transistor that is on when the potential difference is equal to or greater than the reference voltage and the slew rate control circuit is in a falling slew state, and a second driver transistor configured to output the second signal when the second switch transistor is on (and during which the second driver transistor may be diode-connected). Herein, each of the first switch transistor and the second switch transistor may have a body that may be connected to an output signal line.

An output buffer circuit according to further embodiments of the present invention includes an input circuit configured to output a first signal and a second signal in response to an input signal, a slew rate control circuit configured to connect one of the first signal and the second signal to an output terminal and control a slew rate of an output signal based on or in response to a potential difference between the input signal and the output signal; and a driver control circuit configured to connect a power supply line with a compensation capacitor based on or in response to an input control signal, wherein the driver control circuit includes a first control circuit between a highest level power supply line and a first output line of the input circuit, a second control circuit between a lowest level power supply line and a second output line of the input circuit, a first compensation capacitor connected to the first control circuit and the output signal line, and a second compensation capacitor connected to the second control circuit and the output signal line.

The first control circuit may include a first switch connected to the input circuit and the first compensation capacitor, and a second switch connected to the highest level power supply line and the first compensation capacitor. The second control circuit may include a third switch connected to the input circuit and the second compensation capacitor, and a fourth switch connected to the lowest level power supply line and the second compensation capacitor. When the input signal rises), a first control signal turns the first switch and the third switch off, and a second control signal turns the second switch and the fourth switch on, which may be an inverted first control signal, so that the first compensation capacitor is connected to the highest level power supply line, and the second compensation capacitor is connected to the lowest level power supply line.

The present invention has the following effects, provided by the above configuration(s).

The output buffer circuit boosts the slew rate by selectively diode-connecting the driver transistors (e.g., to the output signal) based on or in response to potential difference between the input signal and the output signal (and/or between one of the input and output signals and a reference voltage), whereby there is an effect of boosting the slew rate without increasing the current consumption.

In addition, the output buffer circuit is configured to connect a driver control circuit having a plurality of switches and compensation capacitors between the input circuit and the slew rate control circuit, to prevent the occurrence of a short circuit current during slew rate boosting.

In addition, the output buffer circuit connects the output signal to the body of the driver transistor, to eliminate the body effect of the transistor.

The output buffer circuit also improves the slew rate boosting effect by removing the body effect of the transistor.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Hereinafter, embodiments of the present invention will be described in detail with reference to the accompanying drawings. Embodiments of the present invention can be modified in various forms, and the scope of the present invention should not be interpreted as being limited to the following embodiments, but should be interpreted based on the claims. Further, the embodiments herein are provided as a reference for more fully illustrating the present invention to those skilled in the art.

Figure 1:
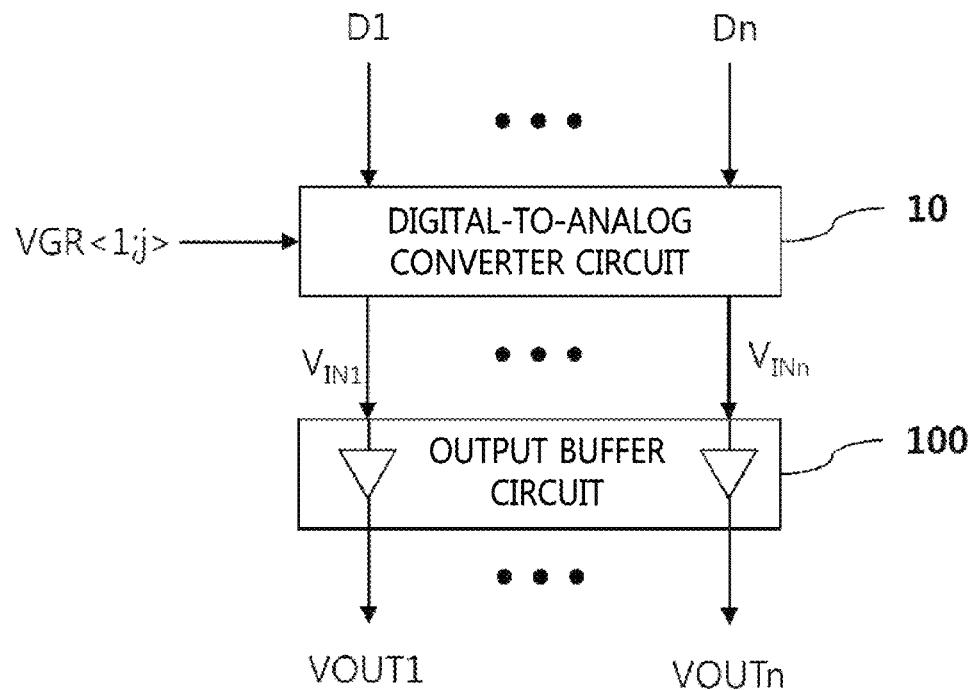
FIG. 1 is a view illustrating an exemplary display driving apparatus including an output buffer circuit according to various embodiments of the present invention.

FIG. 1 is a view illustrating a display driving apparatus including an output buffer circuit according to embodiments of the present invention.

Hereinafter, a display driving apparatus according to the present invention will be described in detail with reference to the accompanying drawings.

Referring to FIG. 1, the display driving apparatus includes a digital-to-analog converter circuit 10 and an output buffer circuit 100. Although not shown in FIG. 1, a source driving circuit may include a recovery circuit configured to recover a data signal from a timing controller input signal, a latch circuit configured to latch the restored data signal, and the like.

The digital-to-analog converter circuit 10 selects a gray voltage VGR<1:j> corresponding to data signals D1 to Dn, and converts the selected gray voltage VGR<1:j> into data voltages $V_{IN1}$ to $V_{INn}$ and provides the same to the output buffer circuit 100.

The output buffer circuit 100 buffers the data voltages $V_{IN1}$ to $V_{INn}$ from the digital-to-analog converter circuit 10 and outputs the source driving signals $V_{IN1}$ to data lines of a display panel (not shown).

The output buffer circuit 100 includes a plurality of output buffers to prevent distortion of the source driving signals $V_{IN1}$ to $V_{INn}$ supplied to the data lines. An operational amplifier may be used as an output buffer.

Figure 2:
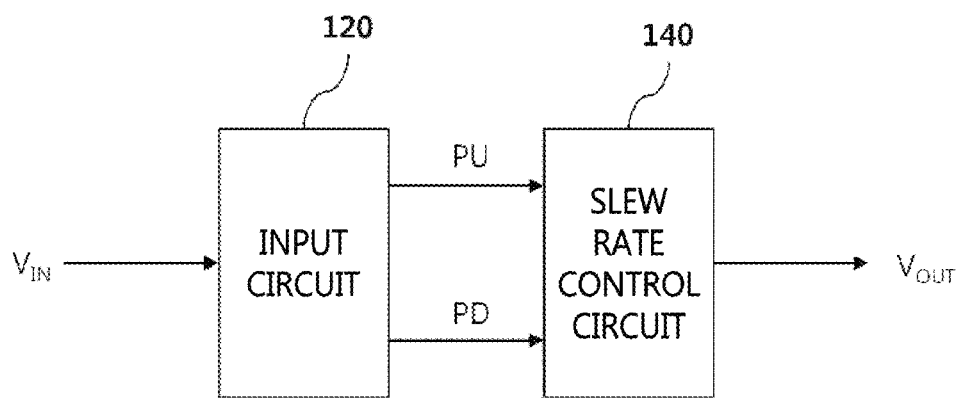
FIGS. 2 and 3 are views illustrating an exemplary output buffer circuit according to various embodiments of the present invention.
Figure 3:
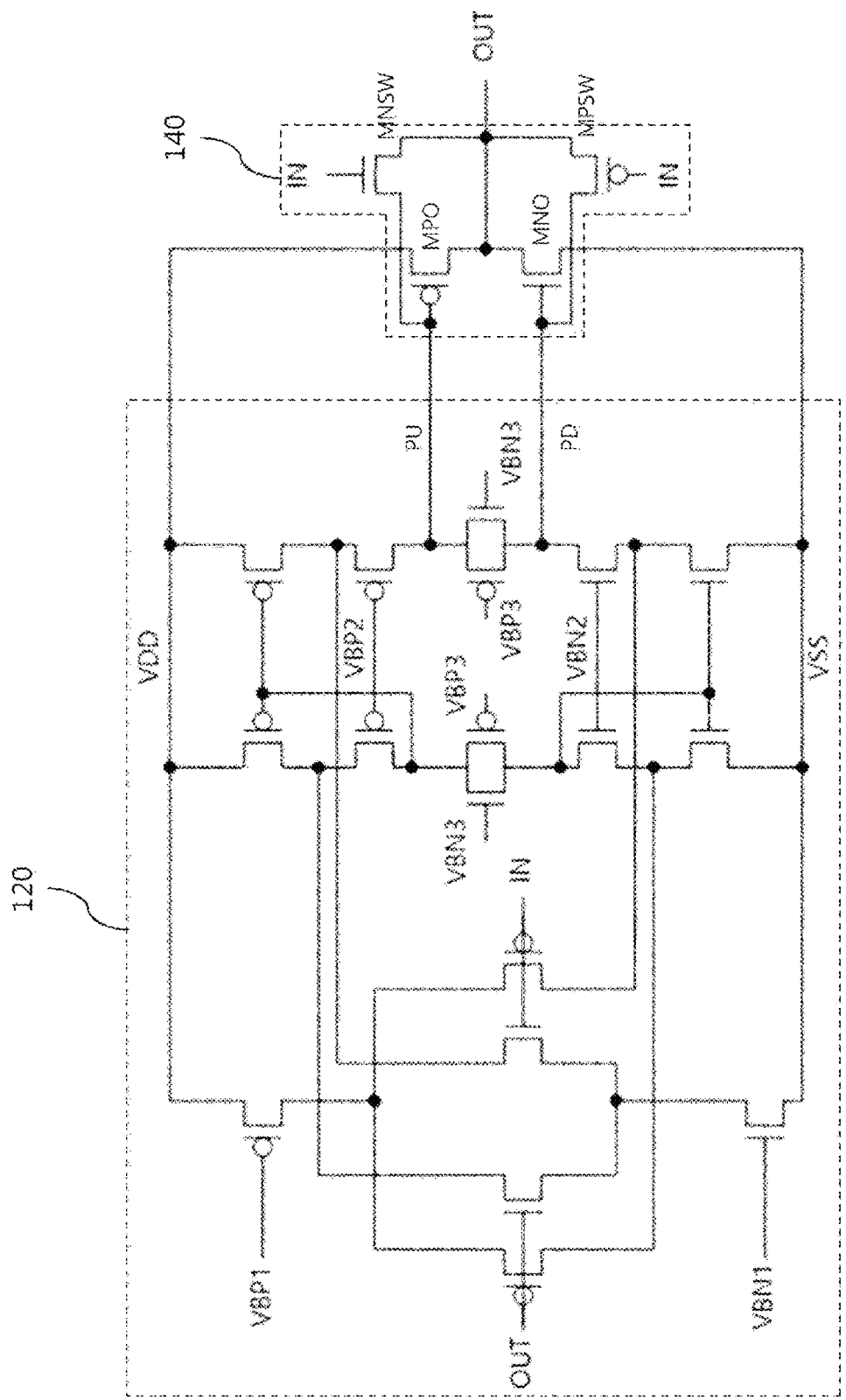

FIGS. 2 and 3 are views illustrating an output buffer circuit according to embodiments of the present invention.

Referring to FIGS. 2 and 3, the output buffer circuit 100 includes an input circuit 120 and a slew rate control circuit 140.

The input circuit 120 generates a pull-up current and a pull-down current in response to an input signal $V_{IN}$ (which corresponds to the data voltages $V_{IN1}$ to $V_{INn}$ in FIG. 1). The input circuit 120 outputs the pull-up current to the slew rate control circuit 140 through the first output line PU, and outputs the pull-down current to the slew rate control circuit 140 through the second output line PD. The pull-up current and the pull-down current complementarily vary in magnitude depending on the magnitude of the input signal $V_{IN}$. Here, the pull-up current and the pull-down current correspond to the first signal and the second signal described herein, respectively.

Meanwhile, according to various embodiments of the present invention, the output buffer circuit 100 having a high slew rate is provided without increasing the current consumption, and herein, the main configuration thereof is related to the slew rate control circuit 140, and thus the detailed configuration of the input circuit 120 will be omitted.

The slew rate control circuit 140 boosts the slew rate by selectively diode-connecting the driver transistor based on or in response to the input signal (e.g., $V_{IN}$) and the output signal (e.g., $V_{OUT}$). That is, the slew rate control circuit 140 uses a potential difference between the input signal (e.g., IN in FIG. 3) and the output signal (e.g., OUT in FIG. 3) when a transition of the input signal IN occurs, in order to increase the slew rate. The slew rate control circuit 140 boosts the slew rate by selectively diode-connecting the first driver transistor MPO and the second driver transistor MNO using a potential (e.g., voltage) difference between the input signal IN and the output signal OUT.

The slew rate control circuit 140 determines a slew state based on or in response to the input signal IN and the output signal OUT. The slew rate control circuit 140 determines that the slew state is a rising slew state when the input signal IN (e.g., the input signal voltage) is greater than the output signal OUT (e.g., the output signal voltage). The slew rate control circuit 140 determines that the slew state is a falling slew state when the input signal IN (e.g., the input signal voltage) is less than the output signal OUT (e.g., the output signal voltage).

The slew rate control circuit 140 compares a detection voltage Vgs (not shown) between the input signal IN and the output signal OUT with a reference voltage Vth (not shown) to determine whether or not to boost the slew rate. Herein, the detection voltage Vgs is an example of a voltage or voltage difference between the voltage on a gate of a first switch transistor MNSW and the voltage on either a gate of a second switch transistor MPSW or a source/drain terminal of the first switch transistor MNSW (e.g., of the output signal OUT).

The slew rate control circuit 140 boosts the slew rate of the output signal OUT when a potential difference between the input signal IN and the output signal OUT is more than the reference voltage Vth (e.g., where Vth is the threshold voltage of the corresponding switch transistor) in the rising slew state. Herein, the slew rate control circuit 140 boosts the slew rate because the first switch transistor MNSW is turned on and the first driver transistor MPO becomes or functions as a diode-connected transistor.

The slew rate control circuit 140 turns off the first switch transistor MNSW when a voltage difference between the input signal IN and the output signal OUT becomes equal to or less than the reference voltage Vth after slew rate boosting (or alternatively, the voltage of the input signal IN decreases below a predetermined threshold, such as Vth). As a result, the amplifier operates (e.g., to increase the slew rate) in the rising slew mode.

The slew rate control circuit 140 also boosts the slew rate when a potential difference between the input signal IN and the output signal OUT is less than the reference voltage Vth in the falling slew state. Herein, the slew rate control circuit 140 boosts the slew rate because the second switch transistor MPSW is turned on (e.g., in the falling slew state), and the second driver transistor MNO becomes or functions as a diode-connected transistor.

The slew rate control circuit 140 turns off the second switch transistor MPSW when the voltage difference between the input signal IN and the output signal OUT becomes greater than or equal to the reference voltage Vth after slew rate boosting (or, alternatively, the voltage of the input signal IN increases above a predetermined threshold, such as VDD−Vth). As a result, the amplifier operates (e.g., to increase the slew rate) in the falling slew mode.

To this end, the slew rate control circuit 140 includes a first driver transistor MPO, a second driver transistor MNO, a first switch transistor MNSW, and a second switch transistor MPSW.

The first driver transistor MPO may include a PMOS transistor. A gate of the first driver transistor MPO is connected to a first output line PU of the input circuit 120, which outputs the pull-up current. A source of the first driver transistor MPO is connected to a VDD line. A drain of the first driver transistor MPO is connected to a drain of the second driver transistor MNO.

The second driver transistor MNO may include an NMOS transistor. A gate of the second driver transistor MNO is connected to the second output line PD of the input circuit 120, which outputs the pull-down current. A source of the second driver transistor MNO is connected to a VSS line. The drain of the second driver transistor MNO is connected to the drain of the first driver transistor MPO.

The first switch transistor MNSW may include an NMOS transistor. A gate of the first switch transistor MNSW is connected to an input line, to which the input signal IN is applied. A source of the first switch transistor MNSW is connected to the first output line PU of the input circuit 120. A drain of the first switch transistor MNSW is connected to a drain of the second switch transistor MPSW.

The second switch transistor MPSW may include a PMOS transistor. A gate of the second switch transistor MPSW is connected to the input line, to which the input signal IN is applied. A source of the second switch transistor MPSW is connected to the second output line PD of the input circuit 120. The drain of the second switch transistor MPSW is connected to the drain of the first switch transistor MNSW.

Herein, the drains of the first driver transistor MPO, the second driver transistor MNO, the first switch transistor MNSW, and the second switch transistor MPSW are connected to an output line configured to output the output signal OUT.

Figure 4:
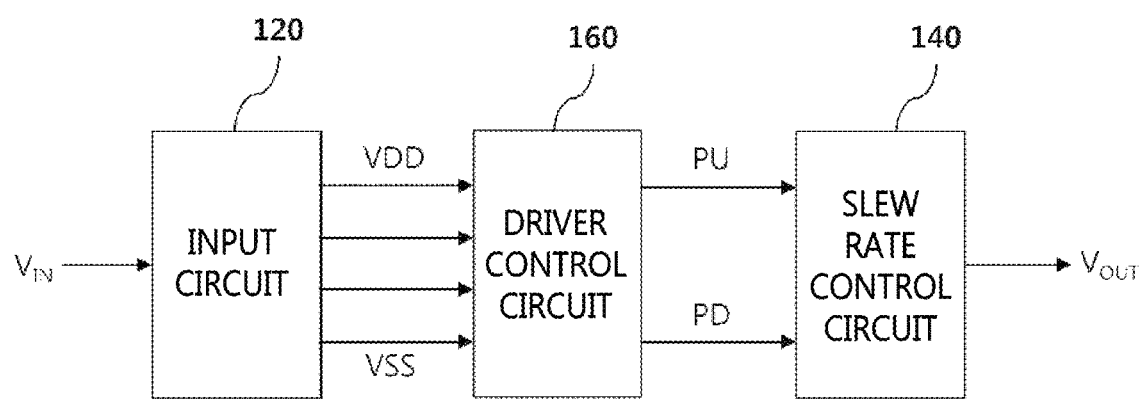
FIGS. 4 and 5 are views illustrating a modified example of the exemplary output buffer circuit according to various embodiments of the present invention.
Figure 5:
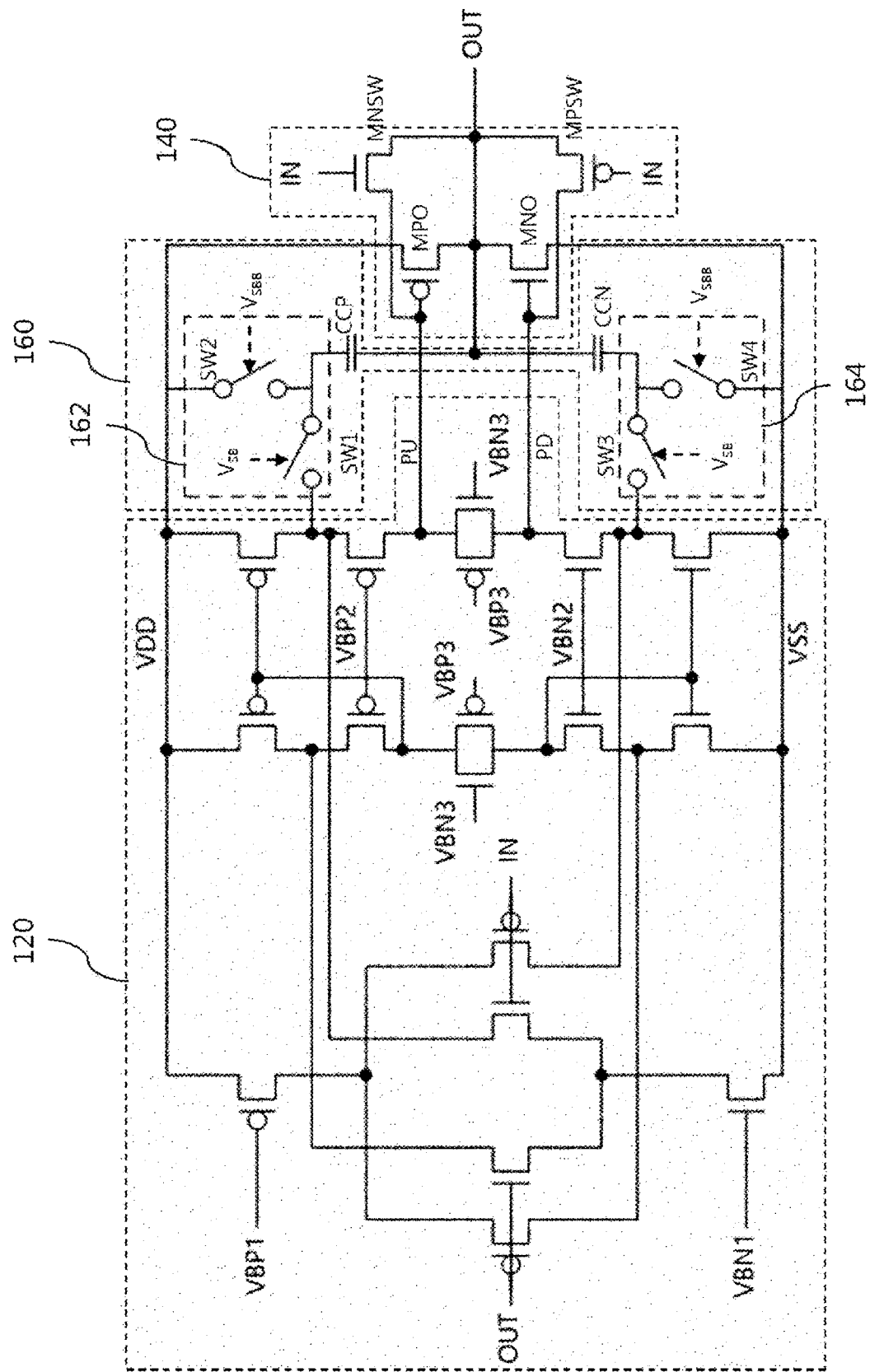
Figure 6:
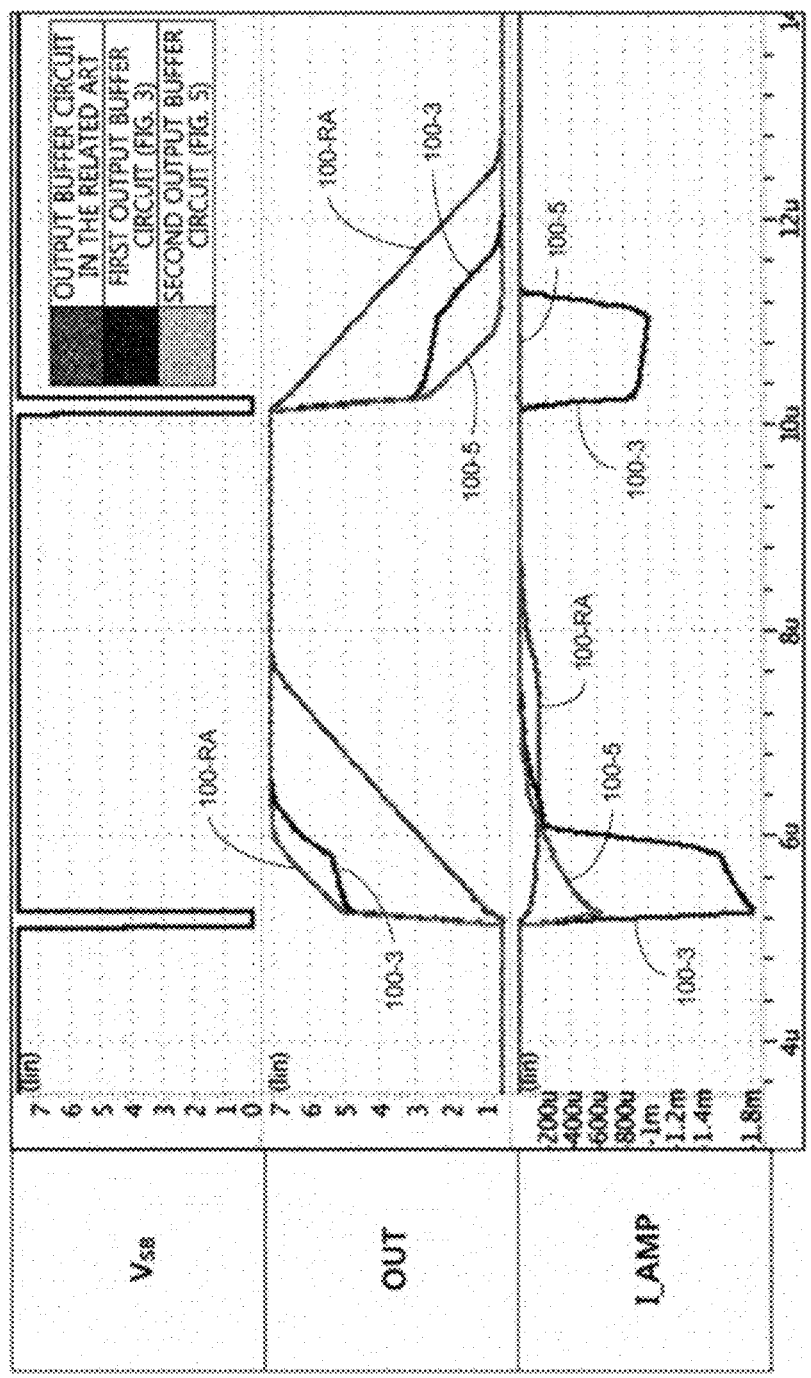
FIG. 6 is a view illustrating a comparison between an output buffer circuit in the related art, an exemplary output buffer circuit according to an embodiment of the present invention, and a modified example of the exemplary output buffer circuit according to another embodiment of the present invention.

Hereinafter, a modified example of the output buffer circuit 100 according to embodiments of the present invention will be described with reference to the accompanying drawings. FIGS. 4 and 5 are views illustrating a modified example of the exemplary output buffer circuit 100 according to various embodiments of the present invention. FIG. 6 is a diagram illustrating a comparison between an output buffer circuit 100 in the related art, the exemplary output buffer circuit 100 according to one embodiment of the present invention, and a modified example of the exemplary output buffer circuit 100 according to another embodiment of the present invention.

In the output buffer circuit 100, the output signal OUT is quickly transitioned by a diode-like or pass-through connection process of the first driver transistor MPO or the second driver transistor MNO. The pull-up current falling on the first output line PU and the pull-down current rising on the second output line PD are caused due to coupling of a compensation capacitor, thereby generating a short circuit current.

In addition, the output buffer circuit 100 requires an additional recovery time for returning to a normal state, due to the pull-up current falling on the first output line PU and the pull-down current rising on the second output line PD. As a result, a slew rate delay may occur.

As shown in FIGS. 4 and 5, the exemplary output buffer circuit 100 according to various embodiments of the present invention may further include a driver control circuit 160 configured to reduce or prevent the short circuit current.

The driver control circuit 160 is included in the input circuit 120 to prevent the occurrence of or reduce a short circuit current. The driver control circuit 160 is controlled by a short pulse using the first and second control signals $V_{SB}$ and $V_{SBB}$. Here, the second control signal $V_{SBB}$ is an inverted signal of the first control signal $V_{SB}$.

For this purpose, the driver control circuit 160 may include a first control circuit 162 between VDD and the first output line PU, and a second control circuit 164 between VSS and the second output line PD, a first compensation capacitor CCP connected to the first control circuit 162 and the output signal OUT, and a second compensation capacitor CCN connected to the second control circuit 164 and the output signal OUT.

When the input signal IN transitions, the first control signal $V_{SB}$ turns off the first switch SW1 in the first control circuit 162, and the second control signal $V_{SBB}$ turns on the second switch SW2. When the transition of the input signal IN is completed, the first control signal $V_{SB}$ turns on the first switch SW1 in the first control circuit 162, and the second control signal $V_{SBB}$ turns on the switch SW2, thereby making it possible to operate as a normal amplifier. Herein, the first switch SW1 is connected to the input circuit 120 and the first compensation capacitor CCP, and the second switch SW2 is connected to VDD and the first compensation capacitor CCP.

When the input signal IN transitions, the first control signal $V_{SB}$ turns off the third switch SW3 in the second control circuit 164, and the second control signal $V_{SBB}$ turns on the fourth switch SW4. When the transition of the input signal IN is completed, the first control signal $V_{SB}$ turns on the third switch SW3 and by the second control signal $V_{SBB}$ turns off the fourth switch SW4, thereby making it possible to operate as a normal amplifier. Herein, the third switch SW3 is connected to the input circuit 120 and the second compensation capacitor CCN, and the fourth switch SW4 is connected to VSS and the second compensation capacitor CCN.

When the input signal IN rises, the first switch SW1 and the third switch SW3 are turned off by the first control signal $V_{SB}$, and the second switch SW2 and the fourth switch SW4 are turned on by the second control signal $V_{SBB}$, so that the first capacitor CCP is connected to VDD and the second capacitor CCN is connected to VSS.

Herein, as the output signal OUT rises momentarily, the slew rate control circuit 140 boosts the slew rate. Since the second compensation capacitor CCN is connected to VSS, and thus is not affected by coupling, the short circuit current does not occur in the second output line PD.

In addition, when the input signal IN falls, since the first compensation capacitor CPP is connected to VDD, and thus is not affected by coupling, the short circuit current does not occur in the first output line PU.

In addition, the driver control circuit 160 does not cause the first output line PU to fall or the second output line PD to rise, and thus does not require any additional recovery time.

FIG. 6 is a view illustrating a comparison between an output buffer circuit 100-RA in the related art and the exemplary output buffer circuits 100 of FIGS. 3 and 5 according to embodiments of the present invention. Hereinafter, for convenience of description, the output buffer circuit 100 illustrated in FIG. 3 is referred to as a first output buffer circuit 100-3, and the output buffer circuit 100 illustrated in FIG. 5 is referred to as a second output buffer circuit 100-5.

Since the first output buffer circuit 100 includes a slew rate control circuit 140, the first output buffer circuit 100-3 has an increased slew rate compared with the output buffer circuit 100-RA in the related art at the transition period of the input signal. However, a transient short circuit current may occur in the slew rising and falling periods (e.g., of the first output buffer circuit 100-3).

Thus, the first output buffer circuit 100-3 may require an additional recovery time to return to a normal state due to the pull-up current falling on the first output line PU and the pull-down current rising on the second output line PD. As a result, a slew rate delay may occur.

Since the driver output circuit 160 is between the slew rate control circuit 140 and the input circuit 120, the second output buffer circuit 100-5 prevents the occurrence of the short circuit current and does not require additional recovery time, so that a longer slew rate boost occurs as compared to the first output buffer circuit 100-3.

Figure 7:
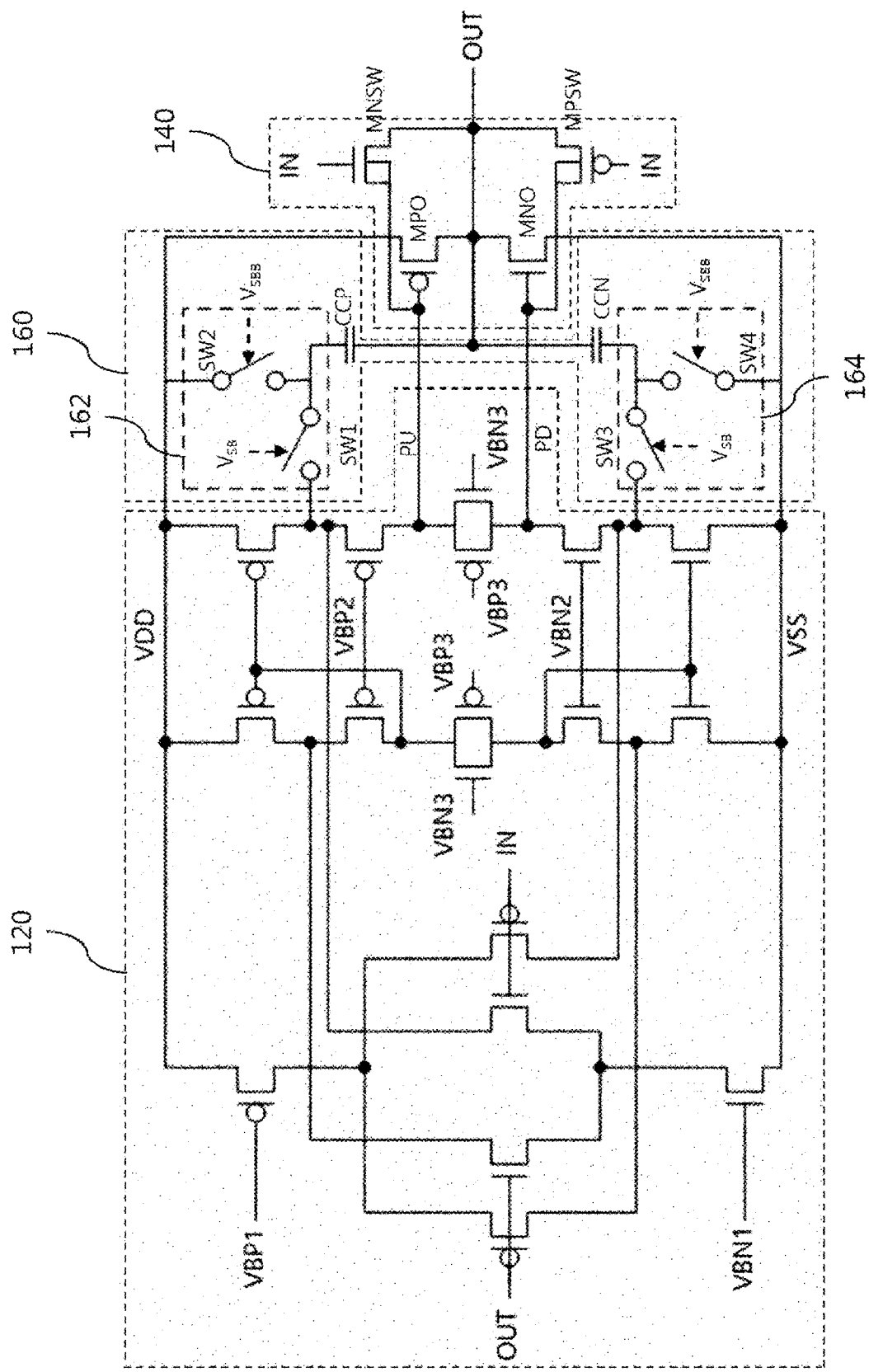
FIGS. 7 and 8 are views illustrating another modified example of the exemplary output buffer circuit according to an embodiment of the present invention.
Figure 8:
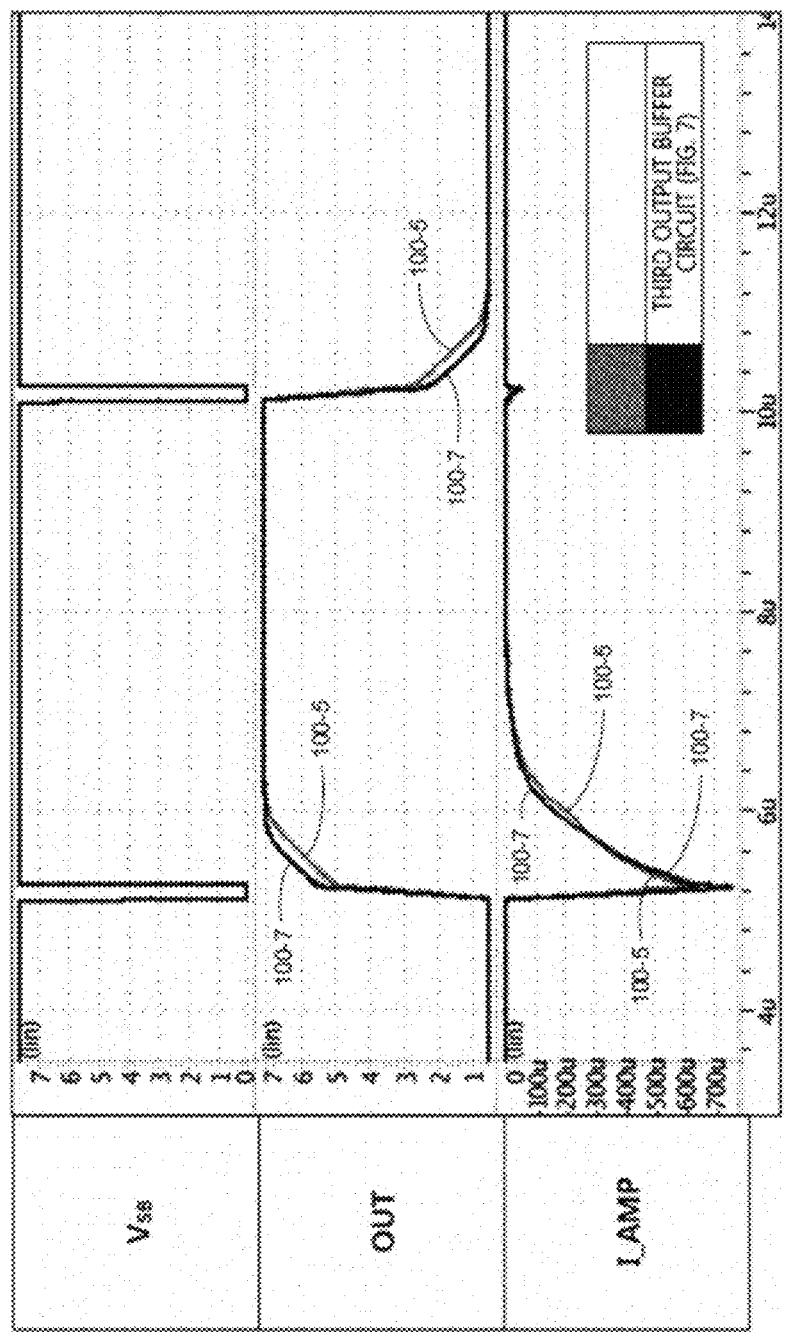

FIGS. 7 and 8 are views illustrating another modified example of the exemplary output buffer circuit 100 according to embodiments of the present invention.

Referring to FIG. 7, the output buffer circuit may connect an output signal OUT to bodies of the first switch transistor MNSW and the second switch transistor MPSW to remove the body effect of the transistors.

Meanwhile, when the first output line PU is not connected to the bodies of the first switch transistor MNSW and the second switch transistor MPSW, the voltage Vgs of the first switch transistor MNSW and the second switch transistor MPSW according to the change in the voltage level of the output signal OUT increases so that the reference voltage Vth also increases. As a result, the switch transistors MNSW and MPSW have a relatively fast switch-off time, but the output buffer circuit has a less-than-completely-optimal slew rate boost.

Referring to FIG. 8, the third buffer output circuit 100-7 (see FIG. 7) may have an improved slew rate boost as compared with the second butter output circuit 100-5 (see FIG. 5), because the output signal OUT is connected to the bodies of the switch transistors MNSW and MPSW to remove the body effect of the transistors.

As described above, the output buffer circuit 100 boosts its slew rate by selectively diode-connecting the driver transistor based on or in response to a comparison of the potential (e.g., voltage) difference between the input signal and the output signal with a reference voltage, boosts the slew rate without increasing current consumption.

In addition, since the driver control circuit may include a plurality of switches and compensation capacitors between the input circuit and the slew rate control circuit in the output buffer circuit 100 according to embodiments of the present invention, a short circuit current may be reduced or prevented during slew rate boosting.

In addition, the body effect of the slew rate boosting (e.g., switch) transistors can be removed by connecting the output signal to the bodies of (i) the driver transistors in the output buffer circuit 100 or (ii) the switch transistors in the slew rate control circuit 140.

Thus, slew rate boosting may be improved because the body effect of certain transistors is removed in the output buffer circuit 100.

Although various embodiments according to the present invention have been described above, modifications can be made in various forms, and it is understood that those skilled in the art may make various modifications and modifications without departing from the scope of the claims of the present invention.

What is claimed is:

1. An output buffer circuit, comprising:
   an input circuit configured to output a first signal and a second signal in response to an input signal; and
   a slew rate control circuit configured to connect one of the first signal and the second signal to an output terminal to control a slew rate of an output signal based on or in response to a potential difference between the input signal and the output signal,
   wherein the slew rate control circuit includes:
   a first driver transistor having a gate connected to a first output line of the input circuit, and a source connected to a highest level power supply;
   a second driver transistor having a gate connected to a second output line of the input circuit, a source connected to a lowest level power supply, and a drain connected to the drain of the first driver transistor;
   a first switch transistor having a gate configured to receive an input power supply and a source connected to the first output line; and
   a second switch transistor having a gate configured to receive the input power supply, a source connected to the second output line, and a drain connected to a drain of the first switch transistor.

2. The circuit of claim 1, wherein the slew rate control circuit controls the slew rate by diode-connecting one of the first driver transistor and the second driver transistor based on or in response to the potential difference.

3. The circuit of claim 1, wherein the slew rate control circuit is in a rising slew state when the input signal is greater than the output signal; and
   the slew rate control circuit is in a falling slew state when the input signal is less than the output signal.

4. The circuit of claim 1, wherein:
   the first switch transistor is on when the potential difference is equal to or greater than a reference voltage in the rising slew state; and
   the first driver transistor is configured to boost the slew rate when the first switch transistor is on and is diode-connected.

5. The circuit of claim 1, wherein:
   the second switch transistor is on when the potential difference is equal to or greater than a reference voltage in the falling slew state; and
   the second driver transistor is configured to boost the slew rate when the second switch transistor is on and is diode-connected.

6. An output buffer circuit, comprising:
   an input circuit configured to output a first signal and a second signal in response to an input signal;
   a slew rate control circuit configured to connect one of the first signal and the second signal to an output terminal and control a slew rate of an output signal based on or in response to a potential difference between the input signal and the output signal; and
   a driver control circuit configured to connect a power supply line with a compensation capacitor based on or in response to an input control signal, wherein the driver control circuit includes:
   a first control circuit between the highest level power supply line and a first output line of the input circuit;
   a second control circuit between the lowest level power supply line and a second output line of the input circuit;
   a first compensation capacitor connected to the first control circuit and an output signal line; and
   a second compensation capacitor connected to the second control circuit and the output signal line.

7. The circuit of claim 6, wherein the driver control circuit (i) connects a highest level power supply line to a first compensation capacitor when a first control signal is active, and (ii) connects a lowest level power supply line to a second compensation capacitor when a second control signal is active.

8. The circuit of claim 6, wherein the first control circuit connects the first compensation capacitor to the highest level power supply line when the input signal transitions and the first control signal is active.

9. The circuit of claim 6, wherein the first control circuit includes:
   a first switch connected to the input circuit and the first compensation capacitor; and
   a second switch connected to the highest level power supply line and the first compensation capacitor.

10. The circuit of claim 9, wherein the first control circuit is configured to connect the first compensation capacitor with the highest level power supply line by turning the first switch off and the second switch on when the input signal transitions and the first control signal is active.

11. The circuit of claim 9, wherein the second control circuit is configured to connect the second compensation capacitor to the lowest level power supply line when the second control signal is active.

12. The circuit of claim 11, wherein the second control circuit includes:
   a third switch connected to the input circuit and the second compensation capacitor; and
   a fourth switch connected to the lowest level power supply line and the second compensation capacitor.

13. The circuit of claim 12, wherein the second control circuit is configured to connect the second compensation capacitor to the lowest level power supply line by turning the third switch off and the fourth switch on when the input signal transitions and the first control signal is active.

14. An output buffer circuit, comprising:
   an input circuit configured to output a first signal and a second signal in response to the input signal; and
   a slew rate control circuit configured to connect one of the first signal and the second signal to an output terminal and control a slew rate of an output signal based on or in response to a potential difference between the input signal and the output signal,
   wherein the slew rate control circuit includes:
      a first switch transistor that is on when the potential difference is equal to or greater than a reference voltage and the slew rate control circuit is in a rising slew state;
      a first driver transistor configured to output the first signal when the first switch transistor is on;
      a second switch transistor that is on when the potential difference is equal to or greater than the reference voltage and the slew rate control circuit is in a falling slew state; and
      a second driver transistor configured to output the second signal when the second switch transistor is on,
   wherein each of the first switch transistor and the second switch transistor has a body connected to an output signal line.

15. An output buffer circuit, comprising:
   an input circuit configured to output a first signal and a second signal in response to an input signal;
   a slew rate control circuit configured to connect one of the first signal and the second signal to an output terminal and control a slew rate of an output signal based on or in response to a potential difference between the input signal and the output signal; and
   a driver control circuit configured to connect a power supply line with a compensation capacitor based on or in response to an input control signal,
   wherein the driver control circuit includes:
      a first control circuit between a highest level power supply line and a first output line of the input circuit;
      a second control circuit between a lowest level power supply line and a second output line of the input circuit;
      a first compensation capacitor connected to the first control circuit and an output signal line; and
      a second compensation capacitor connected to the second control circuit and the output signal line.

16. The circuit of claim 15, wherein the first control circuit includes:
   a first switch connected to the input circuit and the first compensation capacitor; and
   a second switch connected to the highest level power supply line and the first compensation capacitor, and
   the second control circuit includes:
      a third switch connected to the input circuit and the second compensation capacitor; and
      a fourth switch connected to the lowest level power supply line and the second compensation capacitor.

17. The circuit of claim 16, wherein when the input signal rises, a first control signal turns the first switch and the third switch off, and a second control signal turns the second switch and the fourth switch on, so that the first compensation capacitor is connected to the highest level power supply line, and the second compensation capacitor is connected to the lowest level power supply line.

* * * * *